US009505165B2

(12) United States Patent
Nakamura et al.

(10) Patent No.: US 9,505,165 B2
(45) Date of Patent: Nov. 29, 2016

(54) NANOIMPRINTING MOLD, METHOD FOR PRODUCING THE NANOIMPRINTING MOLD, NANOIMPRINTING METHOD USING THE NANOIMPRINTING MOLD, AND METHOD FOR PRODUCING PATTERNED SUBSTRATES

(71) Applicant: FUJIFILM Corporation, Minato-ku, Tokyo (JP)

(72) Inventors: Kazuharu Nakamura, Haibara-gun (JP); Satoshi Wakamatsu, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 78 days.

(21) Appl. No.: 14/228,501

(22) Filed: Mar. 28, 2014

(65) Prior Publication Data
US 2014/0209565 A1 Jul. 31, 2014

Related U.S. Application Data

(63) Continuation of application No. PCT/JP2012/074996, filed on Sep. 21, 2012.

(30) Foreign Application Priority Data

Sep. 30, 2011 (JP) .................. 2011-216569

(51) Int. Cl.
B29C 59/02 (2006.01)
B29C 59/00 (2006.01)
(Continued)

(52) U.S. Cl.
CPC .......... *B29C 59/002* (2013.01); *B29C 33/58* (2013.01); *B29C 39/026* (2013.01);
(Continued)

(58) Field of Classification Search
CPC ... B29C 59/02; B29C 59/002; B29C 39/026; B29C 43/021; B82Y 40/00; G03F 7/0002; G03F 7/161
USPC ........................................ 425/385
See application file for complete search history.

(56) References Cited

U.S. PATENT DOCUMENTS

2005/0061773 A1 3/2005 Choi et al.
2008/0174046 A1 7/2008 Choi et al.
(Continued)

FOREIGN PATENT DOCUMENTS

JP 2004-311690 A 11/2004
JP 2007-502715 A 2/2007
(Continued)

OTHER PUBLICATIONS

International Search Report for PCT/JP2012/074996 dated Jan. 29, 2013.

*Primary Examiner* — Alison L Hindenlang
*Assistant Examiner* — Lawrence D Hohenbrink, Jr.
(74) *Attorney, Agent, or Firm* — Sughrue Mion, PLLC

(57) ABSTRACT

A nanoimprinting mold includes: a mold main body having a fine pattern of protrusions and recesses on a surface thereof; and a mold release layer formed on the surface of the mold main body. The mold release layer is formed within a mold release layer forming region, which is a region of the mold main body that includes a patterned region where the fine pattern of protrusions and recesses is formed and has an outer edge positioned outside the outer edge of the patterned region. An outer peripheral mold release layer has a thickness distribution in which the thickness of the outer peripheral mold release layer is locally maximal at positions outside the outer edge of the patterned region, substantially continuously along the entire periphery. Thereby, it becomes possible to restrict the region in which resist flows during nanoimprinting, without employing a mesa type substrate.

8 Claims, 9 Drawing Sheets

(51) Int. Cl.
- *B29C 33/58* (2006.01)
- *B29C 39/02* (2006.01)
- *B29C 43/02* (2006.01)
- *G03F 7/00* (2006.01)
- *B82Y 10/00* (2011.01)
- *B82Y 40/00* (2011.01)
- *G03F 7/16* (2006.01)

(52) U.S. Cl.
CPC ............ *B29C 43/021* (2013.01); *B29C 59/02* (2013.01); *B82Y 10/00* (2013.01); *B82Y 40/00* (2013.01); *G03F 7/0002* (2013.01); *G03F 7/161* (2013.01)

(56) References Cited

U.S. PATENT DOCUMENTS

2010/0084376 A1*  4/2010  Khusnatdinov ........ B82Y 10/00
                                                             216/39
2010/0140841 A1   6/2010  Choi et al.

FOREIGN PATENT DOCUMENTS

| JP | 2007-253410 A | 10/2007 |
| JP | 4514754 B2 | 7/2010 |
| JP | 2010-214859 A | 9/2010 |
| JP | 2011-159924 A | 8/2011 |

* cited by examiner

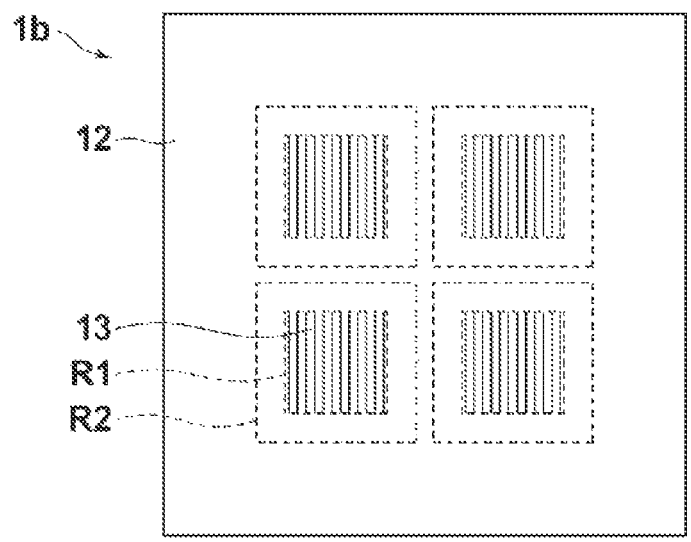
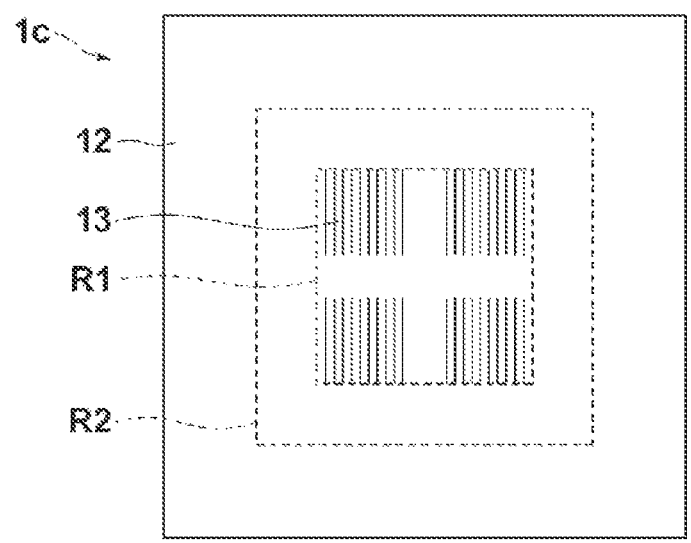

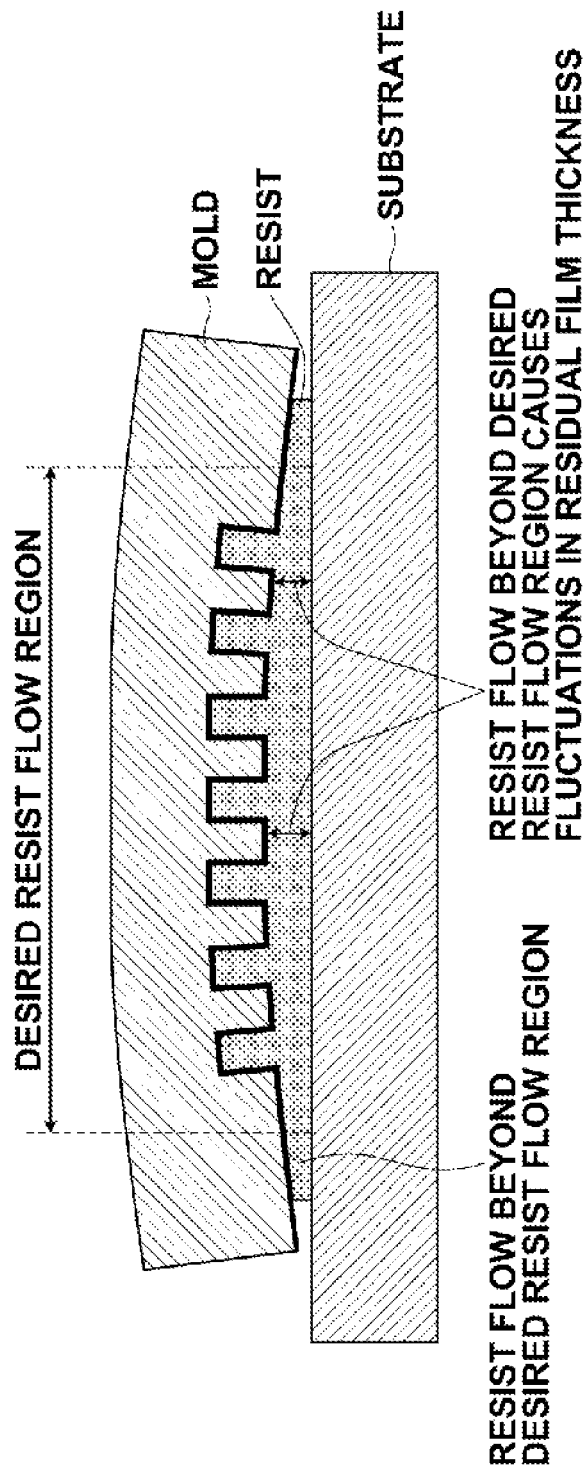

NANOIMPRINTING MOLD, METHOD FOR PRODUCING THE NANOIMPRINTING MOLD, NANOIMPRINTING METHOD USING THE NANOIMPRINTING MOLD, AND METHOD FOR PRODUCING PATTERNED SUBSTRATES

TECHNICAL FIELD

The present invention is related to a mold having a fine pattern of protrusions and recesses on a surface thereof, a method for producing the mold, a nanoimprinting method, and a method for producing a patterned substrate.

BACKGROUND ART

There are high expectations regarding utilization of pattern transfer techniques that employ a nanoimprinting method to transfer patterns onto resist coated on objects to be processed, in applications to produce magnetic recording media such as DTM (Discrete Track Media) and BPM (Bit Patterned Media) and semiconductor devices.

Specifically, the nanoimprinting method, a mold (commonly referred to as a mold, a stamper, or a template), on which a pattern of protrusions and recesses is formed, is pressed against resist coated on a substrate, which is an object to be processed. Pressing of the original onto the resist causes the resist to mechanically deform or to flow, to precisely transfer the fine pattern. If a mold is produced once, nano level fine structures can be repeatedly molded in a simple manner. Therefore, the nanoimprinting method is an economical transfer technique that produces very little harmful waste and discharge. Therefore, there are high expectations with regard to application of the nanoimprinting method in various fields.

In nanoimprinting, it is necessary to restrict the region in which resist flows to a desired region when pressing the resist on a substrate with a mold. In the case that the resist flows beyond the desired region, there is a possibility that imprinting defects, such as fluctuations in the thickness of residual film, will occur, as illustrated in FIG. 13. In addition, if patterned substrates are produced employing a resist pattern having fluctuations in the thickness of residual film, there is a problem that the fluctuations will be reflected in the pattern height (or the pattern depth) of the patterned substrates.

For example, Japanese Patent No. 4514754 discloses a method that performs imprinting using a mesa type substrate having a step on the surface thereof, to restrict the region in which resist flows.

DISCLOSURE OF THE INVENTION

However, in the case that mesa type substrates are employed to execute nanoimprinting, a step of processing the substrates to form the step thereon becomes necessary. As a result, there are cases in which problems, such as the production costs of molds increasing, will occur.

The present invention has been developed in view of the foregoing circumstances. It is an object of the present invention to provide a mold that enables a region in which resist flows during nanoimprinting to be restricted without employing a mesa type substrate. It is another object of the present invention to provide a method for producing the mold. It is still another object of the present invention to provide a nanoimprinting method that employs the mold.

It is a further object of the present invention to provide a method for producing patterned substrates capable of producing molds having a uniform pattern height or a uniform pattern depth.

A nanoimprinting mold of the present invention that achieves the aforementioned objective comprises:

a mold main body having a fine pattern of protrusions and recesses on a surface thereof; and a mold release layer formed on the surface of the mold main body;

the mold release layer being formed within a mold release layer forming region, which is a region of the mold main body that includes a patterned region where the pattern of protrusions and recesses is formed and has an outer edge positioned outside the outer edge of the patterned region; and an outer peripheral mold release layer, which is a part of the mold release layer between the outer edge of the patterned region and the outer edge of the mold release layer forming region, having a thickness distribution in which the thickness of the outer peripheral mold release layer is locally maximal at positions outside the outer edge of the patterned region, substantially continuously along the entire periphery.

In the present specification, the expression "patterned region" refers to a region of the mold (or the mold main body) in which the pattern of protrusions and recesses is formed.

The expression "mold release layer forming region" refers to a region set on the mold main body as a region where the mold release layer is to be formed and refers to a region of the mold where the mold release layer is formed.

The expression "substantially continuously along the entire periphery" preferably refers to a case in which the portion of the outer peripheral mold release layer having the locally maximal thickness continuously surrounds the entire periphery of the patterned region. However, the expression also refers to cases in which there are discontinuous portions and cases in which there are no locally maximal portions in a portion of the angular range of the periphery, within a range that enables the object of the present invention to be achieved.

In the nanoimprinting mold of the present invention, it is preferable for:

the outer peripheral mold release layer to have a thickness distribution in which the thickness of the outer peripheral mold release layer at the outer edge of the mold release layer forming region is locally maximal.

In the nanoimprinting mold of the present invention, it is preferable for:

the outer peripheral mold release layer to have a thickness distribution in which the locally maximal height difference is 1 nm or greater.

A first method for producing a mold of the present invention is a method for producing a nanoimprinting mold equipped with a mold main body having a fine pattern of protrusions and recesses on a surface thereof and a mold release layer formed on the surface, comprising:

preparing the mold main body;

preparing a mold release processing substrate for coating a mold release agent onto the mold, from which corners of a portion corresponding to a mold release layer forming region on the mold main body when the mold main body and the mold release processing substrate are in a predetermined positional relationship have been removed;

coating the mold release agent on the surface of the mold release processing substrate at the portion corresponding to the mold release layer forming region;

pressing the mold main body and the mold release processing substrate against each other in a state in which the predetermined positional relationship is maintained; and separating the mold main body and the mold release processing substrate.

Further, a second method for producing a mold of the present invention is a method for producing a nanoimprinting mold equipped with a mold main body having a fine pattern of protrusions and recesses on a surface thereof and a mold release layer formed on the surface, comprising:

preparing the mold main body, on a mold release layer forming region of which a mold release agent is bound, the mold release layer forming region including a patterned region in which the pattern of protrusions and recesses is formed;

preparing a mold release processing substrate for coating a mold release agent onto the mold;

arranging a plurality of droplets of the mold release agent with predetermined intervals therebetween on the mold release processing substrate at a region corresponding to a region between the outer edge of the patterned region and the outer edge of the mold release layer forming region when the mold main body and the mold release processing substrate are in a predetermined positional relationship;

causing the mold release agent which is bound to the mold main body and the mold release agent on the mold release processing substrate to contact each other in a state in which the predetermined positional relationship is maintained; and separating the mold main body and the mold release processing substrate.

A nanoimprinting method of the present invention comprises:

employing a mold of the present invention as described above;

coating a nanoimprinting substrate with resist;

pressing the mold against the surface of the nanoimprinting substrate which is coated with the resist; and separating the mold from the resist.

A method for producing a patterned substrate of the present invention comprises:

forming a resist film, to which a pattern of protrusions and recesses is transferred, on a substrate to be processed by the nanoimprinting method of the present invention as described above; and performing etching using the resist film as a mask, to form a pattern of protrusions and recesses, corresponding to the pattern of protrusions and recesses transferred onto the resist film, on the substrate to be processed.

The nanoimprinting mold of the present invention is characterized by having the mold release layer formed on the mold release layer forming region, and the outer peripheral mold release layer thereof having a thickness distribution in which the thickness thereof is locally maximal at positions outside the outer edge of the patterned region, substantially continuously along the entire periphery. Thereby, when the mold is pressed against resist coated on a nanoimprinting substrate, the thickness distribution of the outer peripheral mold release layer inhibits the flow of the resist. Therefore, it becomes possible to restrict the region in which resist flows during nanoimprinting without employing a mesa type substrate.

The first method for producing a mold of the present invention is characterized by: preparing the mold release processing substrate for coating a mold release agent onto the mold, from which corners of a portion corresponding to a mold release layer forming region on the mold main body when the mold main body and the mold release processing substrate are in a predetermined positional relationship have been removed; coating the mold release agent on the surface of the mold release processing substrate at the portion corresponding to the mold release layer forming region; pressing the mold main body and the mold release processing substrate against each other in a state in which the predetermined positional relationship is maintained; and separating the mold main body and the mold release processing substrate. Thereby, a mold with an outer peripheral mold release layer having a thickness distribution in which the thickness thereof is locally maximal at positions outside the outer edge of the patterned region substantially continuously along the entire periphery can be produced. As a result, it becomes possible to restrict the region in which resist flows during nanoimprinting without employing a mesa type substrate in the same manner as the mold of the present invention.

The second method for producing a mold of the present invention is characterized by: preparing the mold main body, on a mold release layer forming region of which a mold release agent is bound, the mold release layer forming region including the patterned region in which the pattern of protrusions and recesses is formed; preparing the mold release processing substrate for coating the mold release agent onto the mold; arranging the plurality of droplets of the mold release agent with predetermined intervals therebetween on the mold release processing substrate at the region corresponding to a region between the outer edge of the patterned region and the outer edge of the mold release layer forming region when the mold main body and the mold release processing substrate are in the predetermined positional relationship; causing the mold release agent which is bound to the mold main body and the mold release agent on the mold release processing substrate to contact each other in a state in which the predetermined positional relationship is maintained; and separating the mold main body and the mold release processing substrate. Thereby, a mold with an outer peripheral mold release layer having a thickness distribution in which the thickness thereof is locally maximal at positions outside the outer edge of the patterned region substantially continuously along the entire periphery can be produced. As a result, it becomes possible to restrict the region in which resist flows during nanoimprinting without employing a mesa type substrate in the same manner as the mold of the present invention.

The nanoimprinting method of the present invention is executed employing the mold of the present invention. Therefore, it becomes possible to restrict the region in which resist flows during nanoimprinting without employing a mesa type substrate.

The method for producing patterned substrates of the present invention is executed employing the nanoimprinting method of the present invention, which enables the region in which resist flows to be restricted. As a result, molds having uniform pattern heights or uniform pattern depths can be produced when producing patterned substrates.

BRIEF DESCRIPTION OF THE DRAWINGS

FIG. 7 is a schematic plan view that illustrates another example of a positional relationship between a patterned region and a mold release layer forming region of the mold.

FIG. 8 is a schematic plan view that illustrates another example of a positional relationship between a patterned region and a mold release layer forming region of the mold.

FIG. 13 is a schematic sectional diagram that illustrates the manner in which resist flows while a conventional mold, which cannot restrict the region in which resist flows, is pressed against the resist.

BEST MODE FOR CARRYING OUT THE INVENTION

Figure 1:
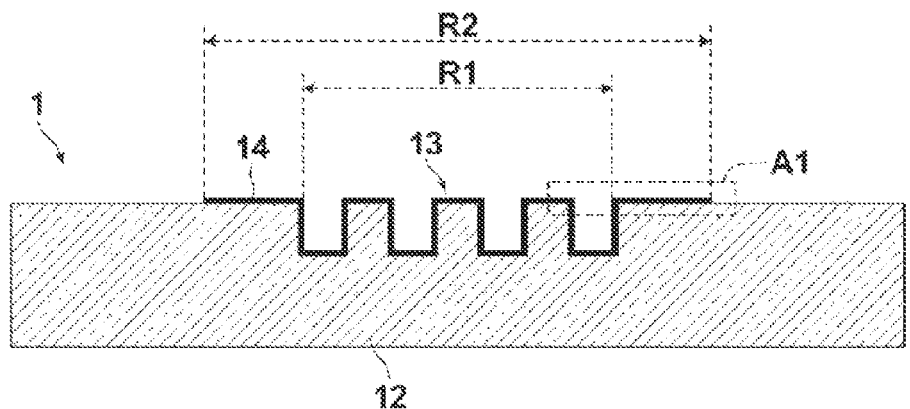
FIG. 1 is a schematic sectional view that illustrates the structure of a nanoimprinting mold according to an embodiment of the present invention.

Hereinafter, embodiments of the present invention will be described with reference to the attached drawings. However, the present invention is not limited to the embodiments to be described below. Note that in the drawings, the dimensions of the constitutive elements are drawn differently from the actual dimensions thereof, in order to facilitate visual recognition thereof.

[Nanoimprinting Mold]

FIG. 1 is a schematic sectional view that illustrates the structure of a mold 1 according to an embodiment of the present invention.

As illustrated in FIG. 1, the mold 1 is equipped with a mold main body 12 having a fine pattern 13 of protrusions and recesses on a surface thereof, and a mold release layer 14 formed on the surface.

(Mold Main Body)

The material of the mold main body 12 may be: a metal, such as silicon, nickel, aluminum, chrome, steel, tantalum, and tungsten; oxides, nitrides, and carbides thereof. Specific examples of the material of the mold main body 12 include silicon oxide, aluminum oxide, quartz glass, Pyrex™, glass, and soda glass. Alternatively, the material of the mold main body 12 may be resin.

Figure 2:
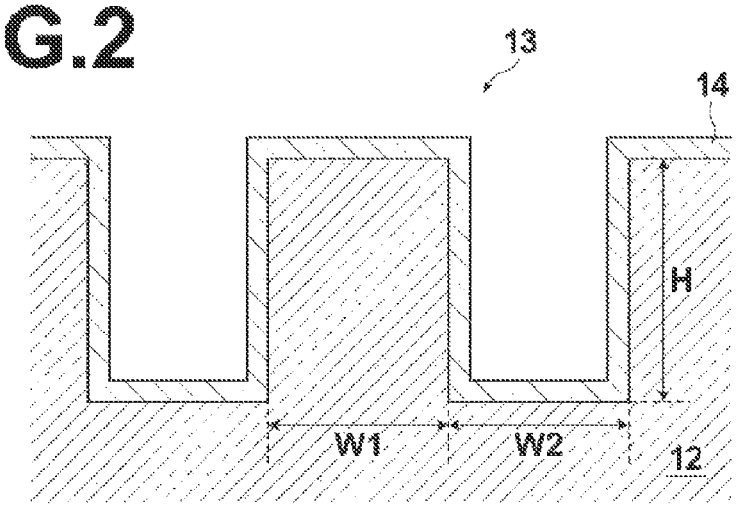
FIG. 2 is a schematic sectional view that illustrates a pattern of protrusions and recesses of the mold.

The shape of the pattern 13 of protrusions and recesses is not particularly limited, and may be selected as appropriate according to the intended use of the nanoimprinting mold. An example of a typical pattern is a line and space pattern as illustrated in FIG. 1 and FIG. 2. The length of the protrusions, the width W1 of the protrusions, the distance W2 among the protrusions, and the height H of the protrusions from the bottoms of the recesses (the depth of the recesses) are set as appropriate in the line and space pattern. For example, the width W1 of the lines is within a range from 10 nm to 100 nm, more preferably within a range from 20 nm to 70 nm, the distance W2 among the lines is within a range from 10 nm to 500 nm, more preferably within a range from 20 nm to 100 nm, and the height H of the lines is within a range from 10 nm to 500 nm, more preferably within a range from 30 nm to 100 nm. In addition, the shapes of the protrusions that constitute the pattern 13 of protrusions and recesses may be dots having rectangular, circular, or elliptical cross sections.

The mold main body 12 described above may be produced by the following procedures, for example. First, a silicon substrate is coated with a photoresist having acrylic resin, such as a novolac resin or PMMA (polymethyl methacrylate) as its main component by the spin coat method or the like, to form a resist layer. Next, a laser beam (or an electron beam) is irradiated onto the silicon substrate while being modulated according to a desired pattern of protrusions and recesses, to expose the pattern on the surface of the photoresist layer. Then, the photoresist layer is developed to remove the exposed portions. Finally, selective etching is performed by RIE (reactive ion etching) or the like, using the photoresist layer after the exposed portions are removed as a mask, to obtain the mold main body having a predetermined pattern of protrusions and recesses.

(Mold Release Layer)

The mold release layer 14 is formed on the surface of the mold 1 to improve the mold release properties between the mold 1 and resist. The mold release layer 14 is formed by a mold release process that binds a mold release agent to the surface of the mold 1, to be described later.

The mold release layer 14 is formed on a mold release layer forming region R2. The mold release layer forming region R2 is a region on the mold main body 12 that includes a patterned region R1 in which the pattern 13 of protrusions and recesses is formed. The outer edge E2 of the mold release layer forming region R2 is outside the outer edge E1 of the patterned region R1. Further, an outer peripheral mold release layer 14a which is present between the outer edge E1 of the patterned region R1 and the outer edge E2 of the mold release layer forming region R2 (an outer peripheral region R3) has a thickness distribution in which the thickness of the outer peripheral mold release layer 14a is locally maximal (increases then decreases) at positions outside the outer edge E1 of the patterned region R1, substantially continuously along the entire periphery.

Figure 3:
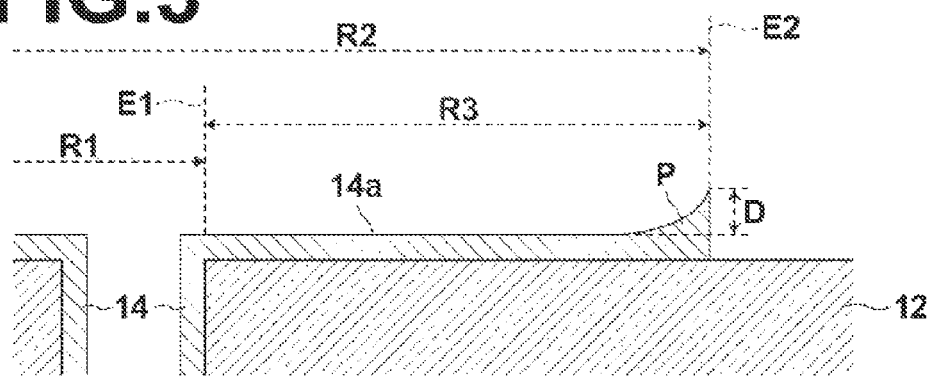
FIG. 3 is a schematic sectional view that illustrates an example of the structure in the vicinity of an outer peripheral mold release layer of the mold.
Figure 4:
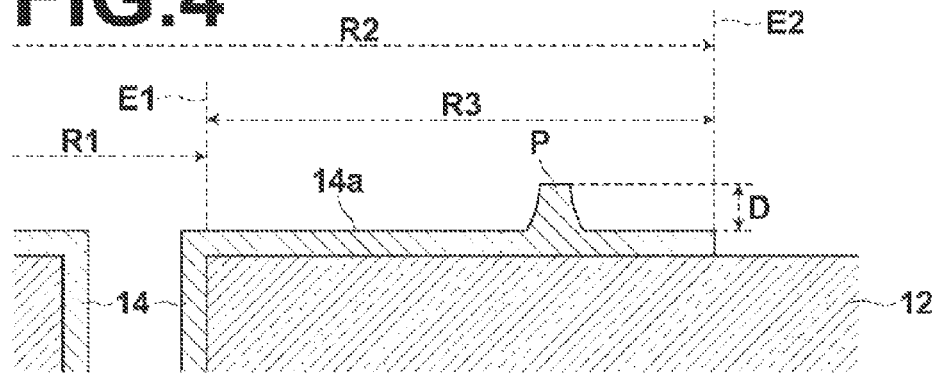
FIG. 4 is a schematic sectional view that illustrates another example of the structure in the vicinity of an outer peripheral mold release layer of the mold.
Figure 5:
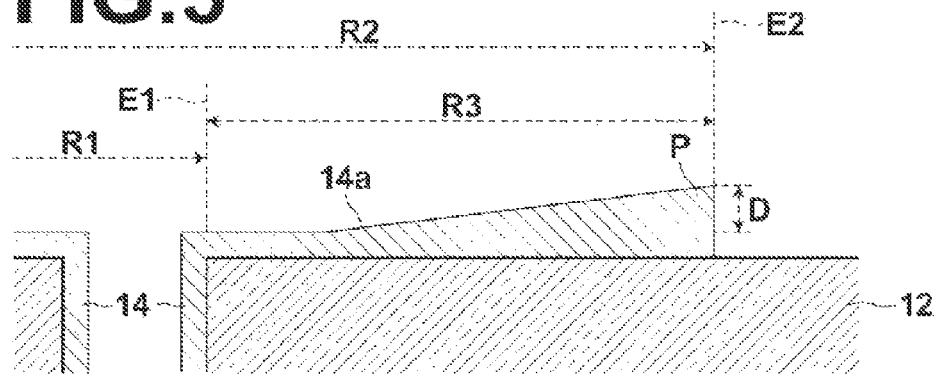
FIG. 5 is a schematic sectional view that illustrates another example of the structure in the vicinity of an outer peripheral mold release layer of the mold.

FIG. 3 through FIG. 5 illustrate examples of such an outer peripheral mold release layer 14a. FIG. 3 through FIG. 5 are magnified sectional views that illustrate the structure of a region A1 in the vicinity of the outer peripheral mold release layer 14a of the mold 1 of FIG. 1. FIG. 3 illustrates an example in which the thickness of the outer peripheral mold release layer 14a is locally maximal at the outer edge E2 of the mold release layer forming region R2. The outer peripheral mold release layer 14a has this thickness distribution along the entire periphery of the annular outer peripheral region R3, and the portion P at which the thickness is locally maximal is continuously connected. This structure enables the region in which resist flows during imprinting to be restricted. The mold release layer 14 having the outer peripheral mold release layer 14a illustrated in FIG. 3 may be produced by a first mold release processing method to be described later. FIG. 4 illustrates an example in which the thickness of the outer peripheral mold release layer 14a is locally maximal within the outer peripheral region R3. In this case, it is preferable for the portion P, at which the thickness is locally maximal, to be positioned toward the outer periphery (toward the outer edge E2 of the mold release layer forming region R2) from the center of the outer peripheral region R3. This is because such a configuration facilitates restriction of the region in which resist flows during imprinting. The mold release layer 14 having the outer peripheral mold release layer 14a illustrated in FIG. 4 may be produced by a second mold release processing method to be described later. FIG. 5 illustrates an example in which the thickness of the outer peripheral mold release layer 14a is locally maximal at the outer edge E2 of the mold release layer forming region R2, and gradually changes toward the inner periphery (toward the outer edge E1 of the patterned region R1). The mold release layer 14 having the outer peripheral mold release layer 14a illustrated in FIG. 5 may be produced by the first mold release processing method or a third mold release processing method to be described later.

The distance between the portion P, at which the thickness of the outer peripheral mold release layer 14a is locally maximal, and the outer edge E1 of the patterned region (the shortest distance between an arbitrary position of the portion P having the locally maximal thickness and the outer edge E1) depends on the shape of the mold main body 12 as a whole and the shape of the patterned region R1. However, it is preferable for the distance to be within a range from almost zero to 20 mm. The reason why the lower limit is almost zero is because resistance during separation of the mold 1 from resist 9 decreases as the region in which resist flows becomes smaller. The reason why the upper limit is 20 mm is because if the distance exceeds 20 mm, resistance during separation of the mold 1 from resist 9 increases, and mold release defects such as peeling of resist will become more likely to occur. Note that it is not necessary for the distance to be uniform along the entire periphery, and it is sufficient for the distance to be within the above range along the entire periphery.

Further, it is preferable for the outer peripheral mold release layer 14a to have a thickness distribution in which a locally maximal height difference D (the difference between the thickness of the locally maximally thick portion P and an average thickness of other portions) is within a range from 0.5 nm to 25 nm.

The reason why the lower limit is 0.5 nm is because the effect of restricting the region in which resist flows to a desired region cannot be sufficiently obtained if the locally maximal height difference D is less than 0.5 nm.

The reason why the upper limit is 25 nm is because if the locally maximal height difference D is greater than 25 nm, it becomes difficult to execute etching such that the pattern height or the pattern depth will be uniform. As a result, fluctuations in the pattern height or the pattern depth will become more likely to occur.

It is preferable for the thickness of the mold release layer 14 to be within a range from 0.1 nm to 10 nm. The reason why the lower limit is 0.1 nm is because resist will become more likely to remain on the surface of the mold when the mold 1 is released from the resist 9 if the thickness of the mold release layer 14 is less than 0.1 nm. The reason why the upper limit is 10 nm is because if the thickness of the mold release layer 14 exceeds 10 nm, aggregated matter and the like will contaminate the patterned region R1. However, it is preferable for the thickness of the portion P, at which the thickness becomes locally maximal, within the outer peripheral mold release layer 14a to be within a range from 0.6 nm to 35 nm.

Figure 6:
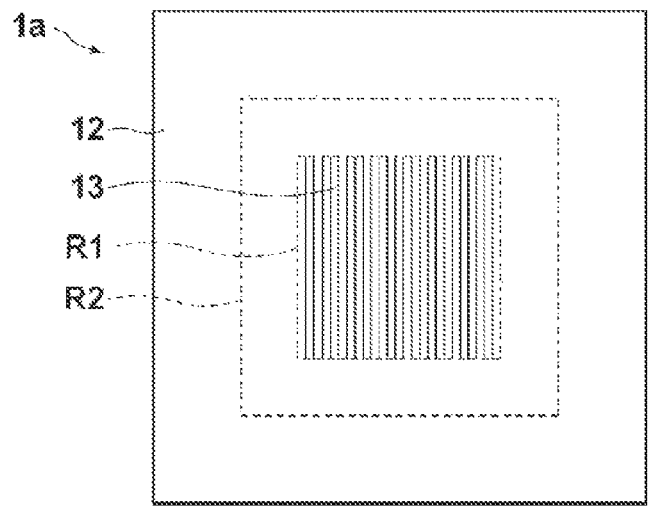
FIG. 6 is a schematic plan view that illustrates an example of a positional relationship between a patterned region and a mold release layer forming region of the mold.

Here, the manner in which the patterned region R1 and the mold release layer forming region R2 are set will be described with reference to FIG. 6 through FIG. 8. FIG. 6 is a schematic plan view that illustrates the positional relationship between a patterned region R1 and a mold release layer forming region R2 of a mold 1a (that is, the mold 1 of FIG. 1 and FIG. 3), on which a pattern 13 of protrusions and recesses is formed in a single location. FIG. 7 is a schematic plan view that illustrates the positional relationship between a patterned region R1 and a mold release layer forming region R2 of a mold 1b, on which a pattern 13 of protrusions and recesses is formed at a plurality of locations. FIG. 8 is a schematic plan view that illustrates another example of the positional relationship between a patterned region R1 and a mold release layer forming region R2 of a mold 1c, on which a pattern 13 of protrusions and recesses is formed at a plurality of locations. The manner in which the patterned region R1 and the mold release layer forming region R2 are set within a single mold is not limited to that illustrated in FIG. 1 and FIG. 3. Specifically, the patterned region R1 and the mold release layer forming region R2 are set to have the positional relationship illustrated in FIG. 6 in the mold of FIG. 1 and FIG. 3. That is, the patterned region R1 is the region in which the pattern 13 of protrusions and recesses is formed. The mold release layer forming region R2 is set as a region that surrounds the patterned region R1 and has an outer edge E2 outside the outer edge E1 of the patterned region R1. Further, in the case that the pattern 13 of protrusions and recesses is formed at a plurality of locations, the patterned region R1 and the mold release layer forming region R2 may be set for each of the plurality of patterns 13 of protrusions and recesses, as illustrated in FIG. 7. By adopting this setting, the regions in which resist flows during imprinting can be restricted to smaller regions. However, the patterned region R1 may be set to include the plurality of patterns 13 of protrusions and recesses as a whole as illustrated in FIG. 8, taking the complexity of the patterns 13 of protrusions and recesses, imprinting conditions, and the intended use into consideration. This is because there are cases in which the effect of restricting the region in which resist flows during imprinting can be sufficiently obtained even if the patterned region R1 is set in this manner.

It is preferable for the mold release agent 6 to be a fluorine compound. It is preferable for the fluorine compound to be a fluorine series silane coupling agent. Commercially available mold release agents such as Optool DSX by Daikin Industries K.K. and Novec EGC-1720 by Sumitomo 3M K.K. may be utilized.

Alternatively, other known fluorine resins, hydrocarbon series lubricants, fluorine series lubricants, fluorine series silane coupling agents, etc., may be utilized.

Examples of fluorine series resins include: PTFE (polytetrafluoroethylene); PFA (tetrafluoroethylene perfluoroalkylvinylether copolymer); FEP (tetrafluoroetylene hexafluoropropylene copolymer); and ETH (tetrafluoroethylene ethylene copolymer).

Examples of hydrocarbon series lubricants include: carboxylic acids such as stearic acid and oleic acid; esters such as stearic acid butyl; sulfonic acids such as octadecylsulfonic acid; phosphate esters such as monooctadecyl phosphate; alcohols such as stearyl alcohol and oleyl alcohol; carboxylic acid amides such as stearic acid amide; and amines such as stearyl amine.

Examples of fluorine series lubricants include lubricants in which a portion or the entirety of the alkyl groups of the aforementioned hydrocarbon series lubricants are replaced with fluoroalkyl groups or perfluoropolyether groups. The perfluoropolyether groups may be perfluoromethylene oxide polymers, perfluoroethylene oxide polymers, perfluoro-n-propylene oxide polymers $(CF_2CF_2CF_2O)_n$, perfluoroisopropylene oxide polymers $(CF(CF_3)CF_2O)_n$, copolymers of the aforementioned polymers, etc. Here, the subscript n represents the degree of polymerization.

It is preferable for the other fluorine series silane coupling agents to have at least one and preferably one to 10 alkoxy silane groups and chloro silane groups in each molecule, and to have a molecular weight within a range from 200 to 10,000. $—Si(OCH_3)_3$ and $—Si(OCH_2CH_3)_3$ are examples of the alkoxy silane group. Meanwhile, examples of the chloro silane groups include $—Si(Cl)_3$. Specific examples of the fluorine series silane coupling agents include: heptadecafluoro-1,1,2,2-tetra-hydrodecyltrimethoxysilane; pentafluorophenylpropyldimethylchlorosilane; tridecafluoro-1,1,2,2-tetra-hydrooctyltriethoxysilane; and tridecafluoro-1,1,2,2-tetra-hydrooctyltrimethoxysilane

[Method for Producing Molds]

Hereinafter, three methods for producing the mold 1 will be described.

(First Embodiment of Method for Producing Molds)

Figure 9:
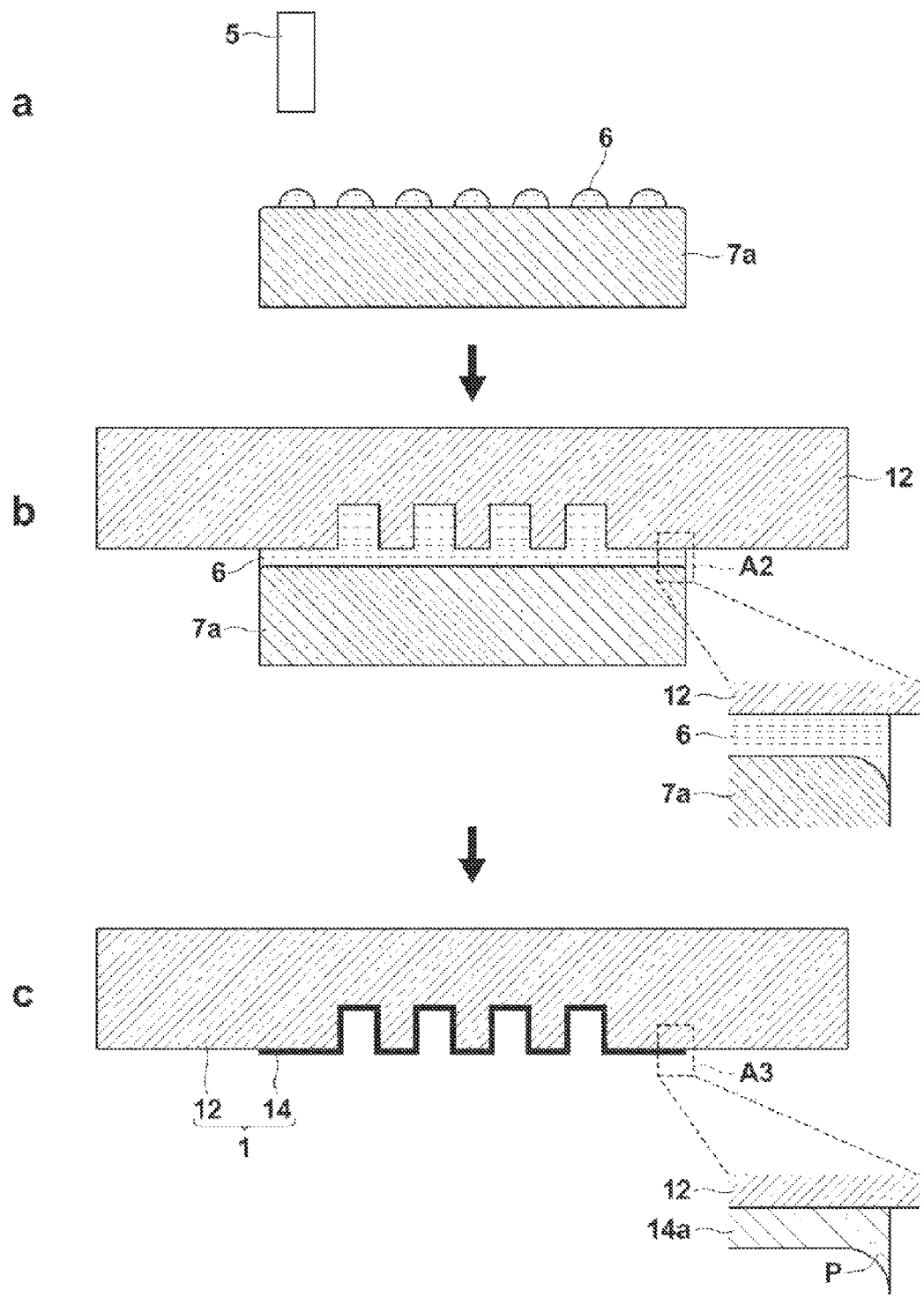
FIG. 9 is a collection of schematic sectional diagrams that illustrate a method for producing molds according to a first embodiment of the present invention.

First, a mold release processing method according to a first embodiment of the present invention will be described. As illustrated in FIG. 9, the mold release processing method of the first embodiment is characterized by: preparing a mold main body 12; preparing a mold release processing substrate 7a for coating a mold release agent 6 onto the mold, having rounded corners at a portion corresponding to a mold release layer forming region R2 on the mold main body 12 when the mold main body 12 and the mold release processing substrate 7a are in a predetermined positional relationship; coating the mold release agent 6 on the surface of the mold release processing substrate 7a at the portion corresponding to the mold release layer forming region R2 with an ink jet printer 5 (a of FIG. 9); pressing the mold main body 12 and the mold release processing substrate 7a against each other in a state in which the predetermined positional relationship is maintained (b of FIG. 9); and separating the mold main body 12 and the mold release processing substrate 7a (c of FIG. 9). The mold release processing method of the first embodiment is executed within a nanoimprinting apparatus.

(Mold Release Processing Substrate)

The mold release processing substrate 7a is a substrate on which the mold release agent 6 is coated to administer the mold release process on the mold main body 12 by the transfer method. In the present embodiment, the mold release processing substrate 7a is formed to have rounded corners as illustrated in the enlarged diagram of region A2 in b of FIG. 9. However, the structure in which the corner has been removed is not limited to a rounded structure, and may be that in which the corner has been cut off in a planar manner. The expression "positional relationship" refers to a positional relationship obtained by aligning the projection position of the pattern 13 of protrusions and recesses with respect to the substrate. The expression "a portion corresponding to a mold release layer forming region R2 on the mold main body 12 when the mold main body 12 and the mold release processing substrate 7a are in a predetermined positional relationship" refers to a portion of the mold release processing substrate 7a that will face and contact the mold release layer forming region R2 when the mold main body 12 and the mold release processing substrate 7a are pressed against each other. The amount of the mold release agent 6 at the outer edge E2 of the mold release layer forming region R2 will become great by the rounded corners being provided, as illustrated in the enlarged diagram of region A2 in b of FIG. 9. As a result, the thickness of the outer peripheral mold release layer 14a at the outer edge E2 of the mold release layer forming region R2 becomes thick, as illustrated in the enlarged diagram of region A3 in c of FIG. 9.

Other than the corner thereof, the shape, structure, size, material, etc. of the mold release processing substrate 7a are not particularly limited, and may be selected as appropriate according to intended use. The surface of the mold release processing substrate 7a that faces the patterned region R1 of the mold main body 12 is the surface on which the mold release agent 6 is coated. In the case that the mold 1 is that for producing data recording media, the mold release processing substrate 7a will generally be discoid in shape. The mold release processing substrate 7a may be of a single layer structure or a laminated structure. The material of the mold release processing substrate 7a may be selected as appropriate from among known materials for substrates. Examples of such materials include: silicon, nickel, aluminum, glass, and resin. These materials may be used singly or in combinations of two or more. The thickness of the mold release processing substrate 7a is not particularly limited. However, it is preferable for the thickness of the mold release processing substrate 7a to be 0.05 mm or greater, and more preferably 0.1 mm or greater. The reason why the lower limit is set as described above is because the mold release processing substrate 7a will flex when the mold release processing substrate 7a and the mold 1 contact each other if the thickness of the mold release processing substrate 7a is less than 0.05 mm, and there is a possibility that a uniform contact state cannot be secured.

(Method for Coating Mold Release Agent)

A method that can arrange droplets of a predetermined amount at predetermined positions, such as the ink jet method and the dispensing method, is employed as the method for coating the mold release agent 6 on the mold release processing substrate 7a. In the case that the mold release agent 6 is coated by the ink jet method, it is preferable for a piezoelectric type of ink jet printer, which is capable of adjusting the droplet amount (the amount of liquid in each arranged droplet) and the expelling speed, to be employed. DMP-2831 by FUJIFILM Dimatix is an example of a piezoelectric type ink jet printer.

The mold release agent 6 is diluted to a predetermined viscosity, in order to be arranged by the ink jet method or the dispensing method. Expulsion conditions are adjusted and set in advance such that the droplet amount will become a predetermined amount. For example, it is preferable for the droplet amount to be adjusted to be greater at regions at which the spatial volume of the pattern of protrusions and recesses of the mold is large, and to be smaller at regions at which the spatial volume of the pattern of protrusions and recesses of the mold is small. Such adjustments are controlled as appropriate according to droplet expulsion amounts (the amount of resist in each expelled droplet).

(Method for Transferring Mold Release Agent)

The mold main body 12 and the mold release processing substrate 7a undergo positional alignment such that the pattern 13 of protrusions and recesses and the mold release agent 6 face each other, after the mold release agent 6 is coated on the mold release processing substrate 7a. Thereafter, the pattern 13 of protrusions and recesses and the mold release agent 6 are placed in close contact while the positional alignment is maintained. Alignment marks may be employed to perform the positional alignment. After the mold main body 12 and the mold release agent 6 are in contact for a predetermined amount of time, the mold main body 12 is separated from the mold release processing substrate 7a, to cause the mold release agent 6 to bind to the mold main body (both physical binding and chemical binding), and the mold release process is completed. Thereby, the portion P at which the thickness is locally maximal is formed in the outer peripheral mold release layer 14a (enlarged view of region A3 in FIG. 9). The mold release process described above can be easily executed within the nanoimprinting apparatus. Therefore, the mold release process is particularly effective in the case that the step of pressing the mold against a nanoimprinting substrate and the step of executing the mold release process are executed in series within the nanoimprinting apparatus.

The amount of time that the mold main body 12 and the mold release agent 6 are maintained in contact is preferably within a range from 1 second to 1 hour. The reason why the lower limit is 1 second is because the mold release agent 6 will not sufficiently bind to the mold main body 12 if the amount of time is less than 1 second, resulting in problems in mold release properties. Meanwhile, the reason why the upper limit is 1 hour is because the amount of the mold release agent 6 bound to the surface of the mold main body 12 will become saturated if the amount of time exceeds 1 hour, and throughput will deteriorate although the mold release properties will not change substantially.

(Second Embodiment of Method for Producing Molds)

Next, a method for producing molds according to a second embodiment of the present invention will be described. The method for producing molds of the second embodiment is characterized by: preparing a mold release processing substrate 7b; arranging a plurality of droplets of the mold release agent 6 on the mold release processing substrate 7b at a region R2' corresponding to the mold release layer forming region R2 of the mold main body 12 when the mold main body 12 and the mold release processing substrate 7b are in a first predetermined positional relationship at predetermined intervals by the ink jet method (a of FIG. 10A); pressing the mold main body 12 and the mold release processing substrate 7b against each other in a state in which the first predetermined positional relationship is maintained (b of FIG. 10A); then separating the mold main body 12 and the mold release processing substrate 7b, to prepare the mold main body 12 having the mold release agent 6 bound to the mold release layer forming region R2 thereof (c of FIG. 10A); arranging a plurality of droplets of the mold release agent 6 on the mold release processing substrate 7b in a region R3' corresponding to the outer peripheral region R3 of the mold main body 12 when the mold main body 12 and the mold release processing substrate 7b are in a second predetermined positional relationship, outside an edge E1' corresponding to the outer edge E1 of the patterned region R1 so as to surround the edge E1' at predetermined intervals by the ink jet method (d of FIG. 10B); causing the mold release agent 6 which is bound to the mold main body 12 and the mold release agent 6 on the mold release processing substrate 7b to contact each other in a state in which the second predetermined positional relationship is maintained (e of FIG. 10B); and separating the mold main body 12 and the mold release processing substrate 7b (f of FIG. 10B). The mold release processing method of the second embodiment is also executed within a nanoimprinting apparatus.

That is, the mold release processing method of the present embodiment can be divided into a primary step (FIG. 10A), in which a large portion of the mold release layer 14 is formed on the mold release layer forming region R2 of the mold main body 12, and a secondary step (FIG. 10B), in which a portion P at which the thickness of the outer peripheral mold release layer 14a becomes locally maximal is added later.

(Mold Release Processing Substrate)

The mold release processing substrate 7b is the same as the mold release processing substrate 7a of the first embodiment except that the corner thereof is not rounded. However, no problems will occur in the mold release processing method even if the corner of the mold release processing substrate 7b is rounded.

It is preferable for the location of the mold release processing substrate 7b at which the mold release agent 6 is coated onto the mold main body 12 in the primary step and the location of the mold release processing substrate 7b at which the mold release agent 6 is coated onto the mold main body 12 in the secondary step to be different. This is in order to prevent residue of the mold release agent 6 employed in the primary step from influencing the secondary step, and also to obviate the need to cleanse the mold release processing substrate 7b. Note that in the present embodiment, the same mold release processing substrate 7b was employed in the primary step and the secondary step. Alternatively, a different substrate may be employed in each of the steps.

(Method for Coating Mold Release Agent)

Figure 10A:
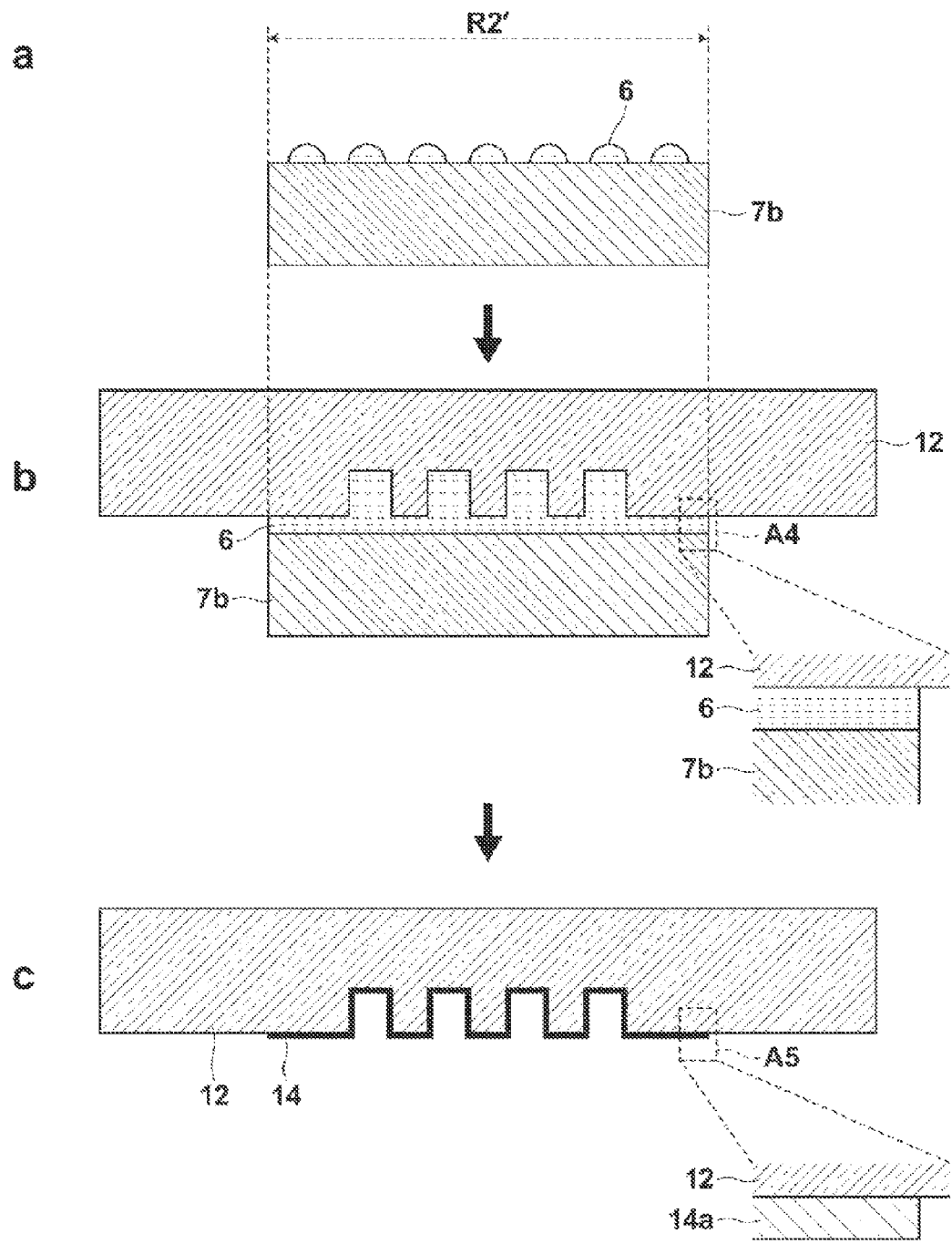
FIG. 10A is a collection of schematic sectional diagrams that illustrate a method for producing molds according to a second embodiment of the present invention.
Figure 10B:
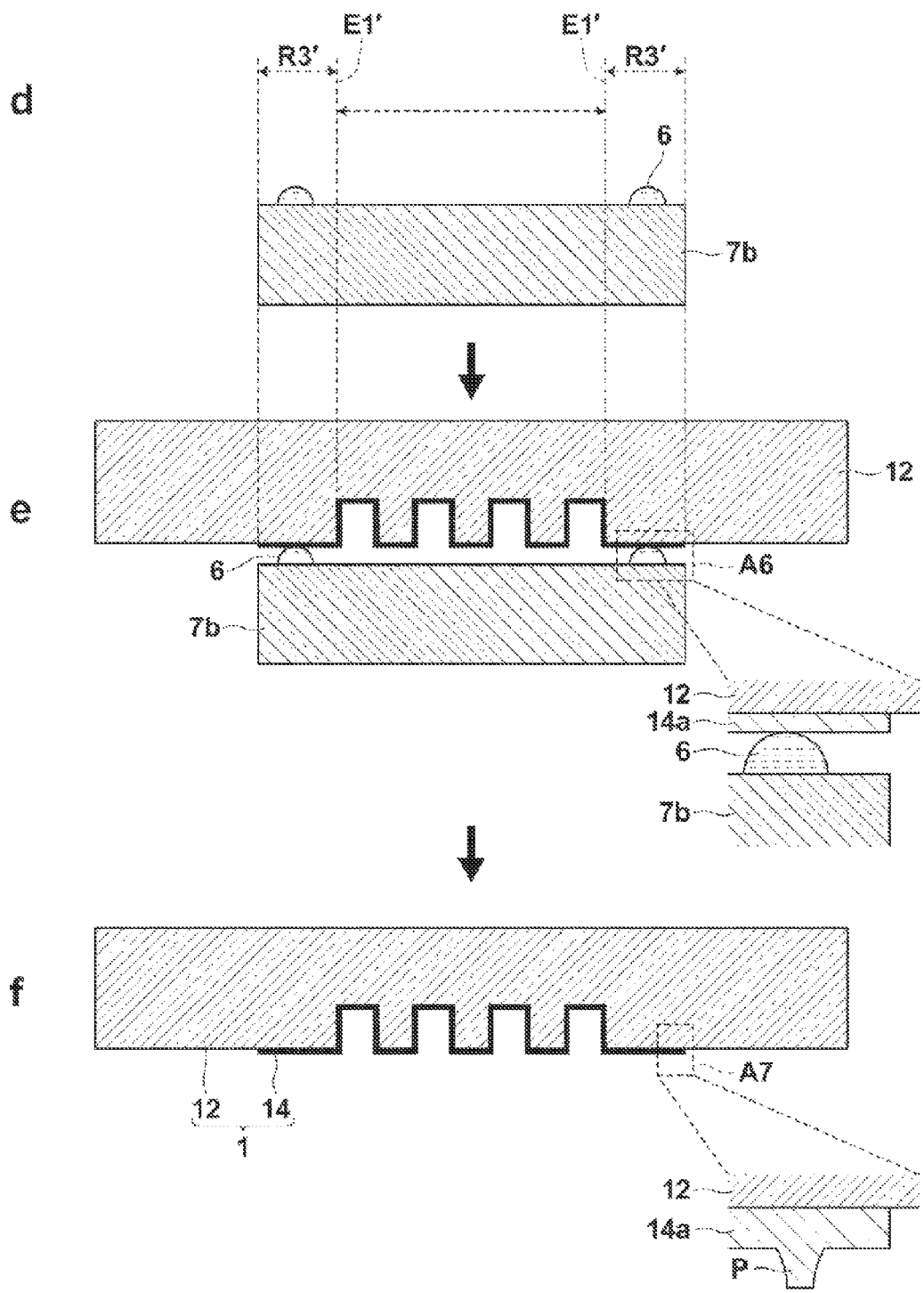
FIG. 10B is a collection of schematic sectional diagrams that illustrate a method for producing molds according to the second embodiment of the present invention.

Coating of the mold release agent 6 is executed by the ink jet method in the same manner as in the first embodiment. In the primary step, droplets are coated across the entirety of the region R2' of the mold release processing substrate 7b corresponding to the mold release layer forming region R2 of the mold main body 12 when the mold main body 12 and the mold release processing substrate 7b are in the first predetermined positional relationship (a of FIG. 10A). In the present embodiment, the entirety of the upper surface of the mold release processing substrate 7b illustrated in FIG. 10A is the corresponding region R2'. In contrast, in the secondary step, droplets are coated on the region R3' of the mold release processing substrate 7b corresponding to the outer peripheral region R3 of the mold main body 12 when the mold main body 12 and the mold release processing substrate 7b are in the second predetermined positional relationship. More specifically, the droplets are coated along the entire periphery of the corresponding region R3' outside the edge E1' corresponding to the outer edge E1 of the patterned region R1 to surround the edge E1' (d of FIG. 10B). Note that there are cases in which the mold release processing substrates differ or the locations at which a single mold release processing substrate is coated differ in the primary step and the secondary step. Therefore, the positional relationship in each of the steps was distinguished as the "first predetermined positional relationship" and the "second predetermined positional relationship".

(Method for Transferring Mold Release Agent)

In the primary step, the mold main body 12 and the mold release processing substrate 7b are placed in close contact while maintaining the first positional relationship, after the mold release agent 6 is coated on the mold release processing substrate 7b (b of FIG. 10A). After the mold main body 12 and the mold release processing substrate 7b are in contact for a predetermined amount of time, the mold main body 12 is separated from the mold release processing substrate 7b, and the primary step is completed (c of FIG.

10A). At this time, the portion P at which the thickness is locally maximal is not formed in the outer peripheral mold release layer 14a (the enlarged views of region A4 and A5 in FIG. 10A). In the secondary step, the mold main body 12 and the mold release processing substrate 7b are placed in close contact while maintaining the second positional relationship, after the mold release agent 6 is coated on the mold release processing substrate 7b (d of FIG. 10B). However, in the secondary step, it is preferable for the mold main body 12 to approach the mold release processing substrate 7b to a degree that causes the mold release layer 14 which has already been formed and the mold release agent 6 on the mold release processing substrate 7b to contact each other (enlarged view of region A6 of FIG. 10B). That is, it is preferable for the mold main body 12 to not be pressed against the mold release processing substrate 7b. This is because the droplets will flow over a wide range, and it will become difficult for height differences to be imparted to the outer peripheral mold release layer 14a if the mold 12 is pressed against the mold release processing substrate 7b. After the mold main body 12 and the mold release processing substrate 7b are in contact for a predetermined amount of time, the mold main body 12 is separated from the mold release processing substrate 7b, and the secondary step is completed. The secondary step forms the portion P at which the thickness is locally maximal in the outer peripheral mold release layer 14a (enlarged view of region A7 in FIG. 10B).

(Third Embodiment of Method for Producing Molds)

Next, a mold release processing method according to a third embodiment of the present invention will be described. The mold release processing method of the third embodiment differs from the mold release processing method of the second embodiment in that the mold release agent 6 is transferred while the mold main body 12 is being flexed in the secondary step. That is, the mold release processing method of the third embodiment is characterized by: preparing a mold release processing substrate 7b; arranging a plurality of droplets of the mold release agent 6 on the mold release processing substrate 7b at a region R2' corresponding to the mold release layer forming region R2 of the mold main body 12 when the mold main body 12 and the mold release processing substrate 7b are in a first predetermined positional relationship at predetermined intervals by the ink jet method (a of FIG. 10A); pressing the mold main body 12 and the mold release processing substrate 7b against each other in a state in which the first predetermined positional relationship is maintained (b of FIG. 10A); then separating the mold main body 12 and the mold release processing substrate 7b, to prepare the mold main body 12 having the mold release agent 6 bound to the mold release layer forming region R2 thereof (c of FIG. 10A); arranging a plurality of droplets of the mold release agent 6 on the mold release processing substrate 7b in a region R3' corresponding to the outer peripheral region R3 of the mold main body 12 when the mold main body 12 and the mold release processing substrate 7b are in a second predetermined positional relationship, outside an edge E1' corresponding to the outer edge E1 of the patterned region R1 so as to surround the edge E1' at predetermined intervals by the ink jet method (d of FIG. 10B); causing the mold release agent 6 which is bound to the mold main body 12 and the mold release agent 6 on the mold release processing substrate 7b to contact each other in a state in which the mold main body 12 is flexed such that the central portion thereof is convex toward the mold release processing substrate 7b (a of FIG. 11); and separating the mold main body 12 and the mold release processing substrate 7b (b of FIG. 11). The mold release processing method of the second embodiment is also executed within a nanoimprinting apparatus.

That is, the mold release processing method of the present embodiment can be divided into a primary step and a secondary step in the same manner as the mold release processing method of the second embodiment. The primary step of the present embodiment is the same as the primary step of the second embodiment. In the secondary step as well, the mold release processing substrate and the method for coating the mold release agent of the present embodiment are the same as those of the second embodiment.

(Method for Transferring Mold Release Agent)

Figure 11:
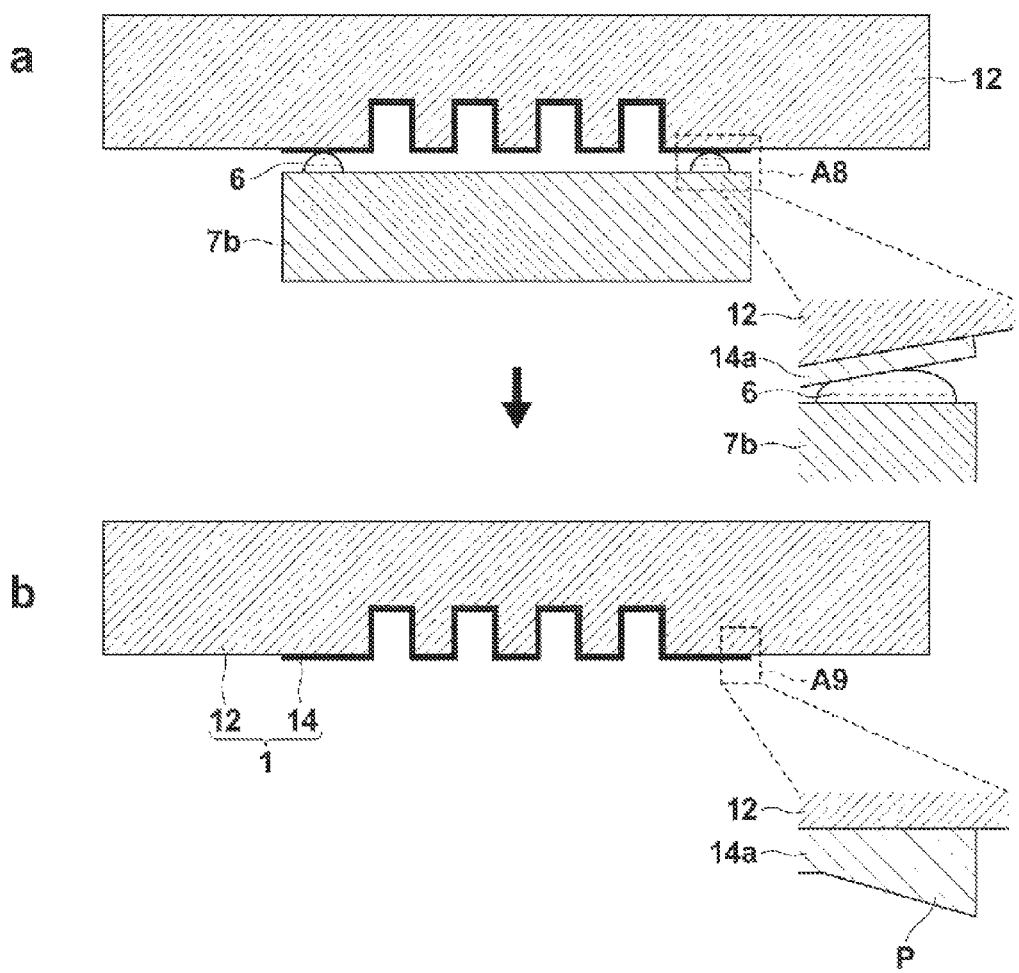
FIG. 11 is a collection of schematic sectional diagrams that illustrate a method for producing molds according to a third embodiment of the present invention.

In the secondary step, the mold main body 12 and the mold release processing substrate 7b are placed in close contact while maintaining the second positional relationship and while the mold main body 12 is flexed such that the central portion thereof is convex toward the mold release processing substrate 7b, after the mold release agent 6 is coated on the mold release processing substrate 7b (the enlarged view of region A8 in a of FIG. 11). Holding only the outer peripheral portion of the mold main body 12 is an example of a method for flexing the mold main body. The outer peripheral mold release layer 14a is formed such that the thickness thereof gradually increases toward the outer periphery thereof, by transferring the mold release agent 6 while flexing the mold main body 12 as described above (the enlarged view of region A9 in b of FIG. 11).

As described above, in the nanoimprinting molds of the present invention, the thickness distribution of the outer peripheral mold release layer inhibits the flow of the resist when the mold is pressed against resist coated on a nanoimprinting substrate. Therefore, it becomes possible to restrict the region in which resist flows during nanoimprinting without employing a mesa type substrate. As a result, imprinting defects, such as fluctuations in the thickness of residual film, can be reduced.

According to the methods for producing molds of the present invention, molds having outer peripheral mold release layers with thickness distributions in which the thickness becomes locally maximal at positions outside the outer edges of patterned regions substantially continuously along the entire peripheries thereof can be produced. Therefore, it becomes possible to restrict the region in which resist flows during nanoimprinting without employing a mesa type substrate in the same manner as the advantageous effects obtained by the molds of the present invention. As a result, imprinting defects, such as fluctuations in the thickness of residual film, can be reduced.

[Nanoimprinting Method Employing the Mold of the Present Invention]

Hereinafter, an embodiment of a nanoimprinting method that employs the mold of the present invention will be described.

Figure 12:
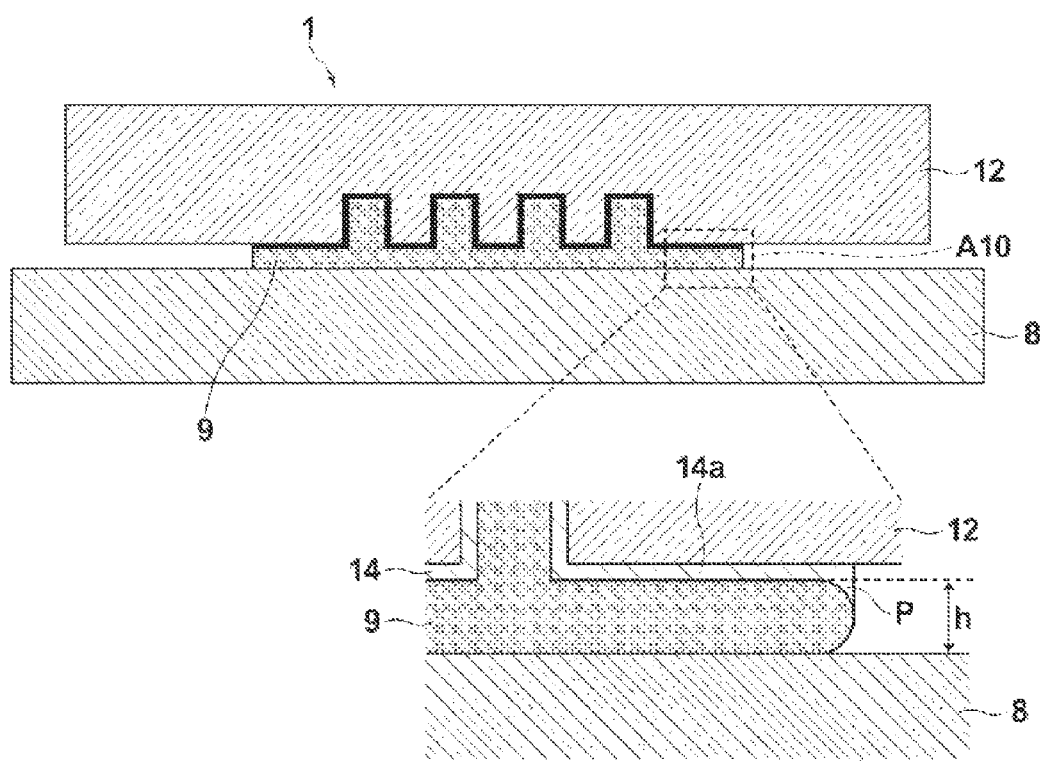
FIG. 12 is a schematic sectional diagram that illustrates the manner in which the region in which resist flows is restricted while a mold is pressed against the resist.

The nanoimprinting method of the present embodiment is characterized by employing a mold 1 of the present invention as illustrated in FIG. 3, for example. A photocurable resist 9 is coated on a quartz nanoimprinting substrate 8, and the mold 1 is pressed against the surface of the nanoimprinting substrate 8 coated with the resist 9 (FIG. 12). Then, ultraviolet light is irradiated onto the resist 9 from the back surface of the nanoimprinting substrate 8 to cure the resist 9. Thereafter, the mold 1 is separated from the resist 9.

(Resist)

The resist is not particularly limited. In the present embodiment, a resist prepared by adding a polymerization initiator (2% by mass) and a fluorine monomer (0.1% by mass to 1% by mass) to a polymerizable compound may be employed. An antioxidant agent (approximately 1% by mass) may further be added as necessary. The resist produced by the above procedures can be cured by ultraviolet light having a wavelength of 360 nm. With respect to resist having poor solubility, it is preferable to add a small amount of acetone or acetic ether to dissolve the resin, and then to remove the solvent. Note that the resist is a photocurable material in the present embodiment. However, the present invention is not limited to such a configuration, and a heat curable material may alternatively be employed.

Examples of the polymerizable compound include: benzyl acrylate (Viscoat™ #160 by Osaka Organic Chemical Industries, K.K.), ethyl carbitol acrylate (Viscoat #190 by Osaka Organic Chemical Industries, K.K.), polypropylene glycol diacrylate (Aronix™ M-220 by TOAGOSEI K.K.), and trimethylol propane PO denatured triacrylate (Aronix M-310 by TOAGOSEI K.K.). In addition, a compound A represented by Chemical Formula 1 below may also be employed as the polymerizable compound.

[Chemical Formula 1]

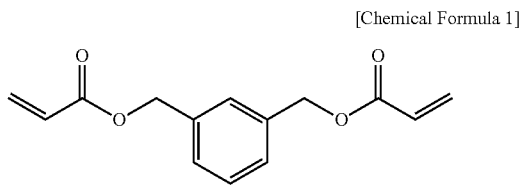 [SMILES: C=CC(=O)OCc1cccc(COC(=O)C=C)c1]

Examples of the polymerization initiating agent include alkyl phenone type polymerization initiating agents, such as 2-(dimethyl amino)-2-[(4-methylphenyl)methyl]-1-[4-(4-morpholinyl)phenyl]-1-butanone (IRGACURE 379 by Toyotsu Chemiplas K.K.)

In addition, a compound B represented by Chemical Formula 2 below may be employed as the fluorine monomer.

[Chemical Formula 2]

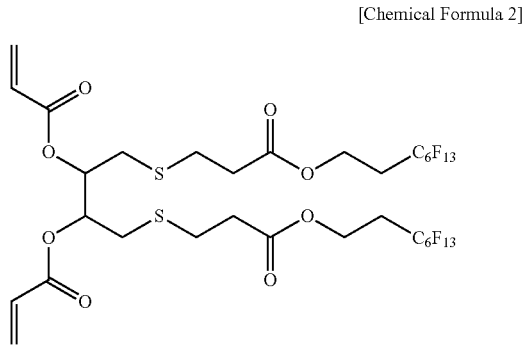

In the case that the resist is coated by the ink jet method, it is preferable for a photocurable resist formed by mixing the compound A represented by Chemical Formula 1, Aronix M-220, IRGACURE 379, and the Compound B represented by Chemical Formula 2 at a mass ratio of 48:48:3:1 to be utilized.

(Nanoimprinting Substrate)

In the case that the mold 1 has light transmissive properties, the nanoimprinting substrate 8 is not limited with regard to the shape, the structure, the size or the material thereof, and may be selected according to intended use. The surface of the nanoimprinting substrate 8 which is the target of pattern transfer is the surface on which the resist 9 id coated. With respect to the shape of the substrate, a substrate having a discoid shape may be utilized in the case that a data recording medium is to be produced, for example. With respect to the structure of the substrate, a single layer substrate may be employed, or a laminated substrate may be employed. With respect to the material of the substrate, the material may be selected from among known materials for substrates, such as silicon, nickel, aluminum, glass, and resin. These materials may be utilized singly or in combination. The thickness of the substrate is not particularly limited, and may be selected according to intended use. However, it is preferable for the thickness of the substrate to be 0.05 mm or greater, and more preferably 0.1 mm or greater. If the thickness of the substrate is less than 0.05 mm, there is a possibility that the substrate will flex during contact with the mold, resulting in a uniform close contact state not being secured. Meanwhile, in the case that the mold 1 does not have light transmissive properties, it is preferable for a quartz substrate to be employed as the nanoimprinting substrate to enable the resist to be exposed to light. The quartz substrate is not particularly limited as long as it has light transmissive properties and a thickness of 0.3 mm or greater, and may be selected as appropriate according to intended use. A quartz substrate having a surface coated with a silane coupling agent may be employed. Further, a quartz substrate having a metal layer formed by Cr, W, Ti, Ni, Ag, Pt, Au, etc., and/or a metal oxide layer formed by $CrO_2$, $WO_2$, $TiO_2$, etc. laminated thereon may be employed. Note that the surface of the laminated layer may be coated with a silane coupling agent. It is preferable for the thickness of the quartz substrate to be 0.3 mm or greater. If the thickness of the quartz substrate is less than 0.3 mm, it is likely to become damaged during handling or due to pressure during imprinting.

(Resist Coating Step)

A method that can arrange droplets of a predetermined amount at predetermined positions, such as the ink jet method and the dispensing method, is employed to coat the nanoimprinting substrate 8 with resist 9, similar to the method for coating the mold release agent 6. The droplet amount and the droplet expulsion amount of the resist 9 are adjusted by the method described with respect to the method for coating the mold release agent 6. It is preferable for the residual film thickness h of the resist 9 to be within range from 3 nm to 25 nm. The reason why the lower limit is 3 nm is because mold release defects such as peeling of resist will become more likely to occur if the residual film thickness h is less than 3 nm. Meanwhile, the reason why the upper limit is 25 nm is because fluctuations will become more likely to occur in the pattern height or the pattern depth when producing patterned substrates if the residual film thickness h is greater than 25 nm. This is due to the fact that it becomes difficult to execute etching such that the pattern height or the pattern depth will become uniform when forming fine patterns on the order of several ten nm if the residual film thickness h is greater than 25 nm.

(Mold Contact Step)

The mold 1 and the nanoimprinting substrate 8 are caused to approach each other in order to perform positional alignment of the pattern of protrusions and recesses of the mold with respect to the droplet pattern arranged on the nanoimprinting substrate 8. Then, the mold 1 or the nanoimprinting substrate 8 are rotated and moved while observing alignment marks with a microscope from the back surface of the nanoimprinting substrate 8, for example. After positional alignment is performed such that the alignment marks are at predetermined positions, the mold 1 is pressed against the resist 9 on the nanoimprinting substrate 8. At this time, it is preferable cause the atmosphere between the mold 1 and the nanoimprinting substrate 8 to be a depressurized atmosphere or a vacuum, to prevent gas from remaining within the pattern of protrusions and recesses. In a He atmosphere, it is preferable for the interior or a pressure vessel to be replaced with He gas at 99% by volume. He passes through the quartz substrate. Accordingly, when the mold 1 and the nanoimprinting substrate 8 are pressurized together by fluid pressure, such residual gas can be eliminated from the interior. There is a possibility that incomplete filling defects due to residual gas will be generated in the case that the atmosphere within the pressure vessel is not substituted by He. In contrast, it is less likely for residual gas to be generated and less likely for incomplete filling defects to occur under depressurized atmospheric conditions.

(Mold Pressurizing Step and Ultraviolet Light Irradiating Step)

It is preferable for the pressure applied when the mold 1 and the nanoimprinting substrate 8 are placed in close contact to be within a range from 0.1 MPa to 5 MPa, more preferably within a range from 0.5 MPa to 3 MPa, and most preferably within a range from 1 MPa to 2 MPa. The reason why the lower limit is 0.1 MPa is because incomplete filling defects will occur due to residual gas not being pushed out of the patterned region, residual gas not passing through a quartz substrate (in the case that the gas is He), or residual gas not dissolving in the resist 6 if the pressure is less than 0.1 MPa. In addition, if the pressure is less than 0.1 MPa, the nanoimprinting substrate 8 will not yield to the fluid pressure, and fluctuations in residual film will be likely to occur. On the other hand, the upper limit is set to 5 MPa because if the pressure is greater than 5 MPa, there is a possibility that the mold 1 and the nanoimprinting substrate 8 will be damaged if a foreign object is interposed therebetween. The pressurizing fluid may be air or an inert gas such as N2, He, and Ar. Thereafter, the photocurable resist 9 is cured by exposing it with ultraviolet light that includes a wavelength of 360 nm, for example, at an irradiation dosage of 300 mJ/cm$^2$.

In the present invention, the outer peripheral mold release layer 14a, which is present in the outer peripheral region R3, has a thickness distribution in which the thickness of the outer peripheral mold release layer 14a is locally maximal at positions outside the outer edge E1 of the patterned region R1 substantially continuously and along the entire periphery. Therefore, the position P at which the thickness of the outer peripheral mold release layer 14a is locally maximal restricts the region in which the resist 9 flows (the enlarged view of region A10 in FIG. 12). As a result, the generation of imprinting defects, such as fluctuations in residual film thickness, can be suppressed.

(Mold Separating Step)

After the mold 1 is pressed against the nanoimprinting substrate 8 and the resist 9 is exposed, the mold 1 is separated from the resist 9. As an example of a separating method, the outer edge portion of one of the mold 1 and the nanoimprinting substrate 8 may be held, while the rear surface of the other of the mold 1 and the nanoimprinting substrate 8 is held by vacuum suction, and the held portion of the outer edge or the held portion of the rear surface is relatively moved in a direction opposite the pressing direction.

(Repeated Mold Release Process)

In nanoimprinting, the mold release agent 6 on the surface of the mold 1 wears as imprinting operations are repeated. Therefore, it is preferable for the mold release process to be administered on the mold after every predetermined number of pressing steps. The mold release process following imprinting operations is the same as the mold release process described above, which is administered when producing the mold 1.

[Method for Producing Patterned Substrates]

Next, an embodiment of a method for producing patterned substrates of the present invention will be described. The present embodiment employs the nanoimprinting method described above to produce a patterned substrate.

First, a resist film, on which a predetermined pattern has been formed by the nanoimprinting method described above, is formed on a surface of a substrate to be processed. Then, etching is performed using the resist film having the pattern formed thereon as a mask, to form a pattern of protrusions and recesses corresponding to the pattern of protrusions and recesses of the resist film. Thereby, a patterned substrate having the predetermined pattern is obtained.

In the case that the substrate to be processed is of a layered structure and includes a mask layer on the surface thereof, a resist film, on which a predetermined pattern has been formed by the nanoimprinting method described above, is formed on a surface of a substrate to be processed having the mask layer. Next, dry etching is performed using the resist film as a mask, to form a pattern of protrusions and recesses corresponding to the pattern of protrusions and recesses of the resist film in the mask layer. Thereafter, dry etching is further performed with the mask layer as an etching stop layer, to form a pattern of protrusions and recesses in the substrate. Thereby, a patterned substrate having the predetermined pattern is obtained.

The dry etching method is not particularly limited as long as it is capable of forming a pattern of protrusions and recesses in the substrate, and may be selected according to intended use. Examples of dry etching methods that may be employed include: the ion milling method; the RIE (Reactive Ion Etching) method; the sputter etching method; etc. From among these methods, the ion milling method and the RIE method are particularly preferred.

As described above, the method for producing patterned substrates of the present invention is executed employing the nanoimprinting method of the present invention, which enables the region in which resist flows to be restricted. As a result, molds having uniform pattern heights or uniform pattern depths can be produced when producing patterned substrates.

EXAMPLES

Examples of the mold, the method for producing the mold, the nanoimprinting method employing the mold, and the method for producing patterned substrates of the present invention and Comparative Examples will be described hereinbelow.

Example 1

A mold main body is constituted by a Si substrate having a diameter of 200 mm, and a concentric line and space pattern constituted by a plurality of space patterns having depths of 100 nm is formed on a first surface thereof. The width of the space pattern and the intervals among spaces (the widths of the lines) are 100 nm and 100 nm, respectively. The entirety of the concentric line and space pattern is formed within a region having a diameter of 60 mm.

(Primary Mold Production Step)

A quartz substrate with a diameter of 70 mm and a corner which is not rounded was employed as a mold release processing substrate. Droplets of a mold release agent were arranged across the entire surface of the quartz substrate by the ink jet method. Then, positional alignment was performed such that the positions of the centers of the mold main body and the quartz substrate are matched, and the mold main body was caused to contact the mold release agent. The state in which the mold main body and the mold release agent are in contact was maintained for 5 minutes, and then the mold and the mold release processing substrate were separated.

(Secondary Mold Production Step)

A quartz substrate with a diameter of 100 mm was prepared as a mold release processing substrate. Droplets of the mold release agent were arranged along the entire periphery of circumferential positions having a radius of 32.5 mm from the center of the quartz substrate by the ink jet method. Then, the mold main body which has undergone the primary step underwent positional alignment with the quartz substrate such that the positions of the centers of the mold main body and the quartz substrate are matched, and the mold main body was caused to contact the mold release agent. The state in which the mold main body and the mold release agent are in contact was maintained for 5 minutes, and then the mold and the mold release processing substrate were separated. Thereby, a mold having a mold release layer with a thickness distribution, in which the thicknesses of circumferential positions at a radius of 32.5 mm from the center (65 mm diameter) are locally maximal continuously along the entire periphery, is obtained.

(Nanoimprinting Method)

After the secondary step, a quartz substrate with a diameter of 150 mm was employed, and droplets of photocurable resist were arranged on the quartz substrate. Then, the mold and the quartz substrate underwent positional alignment such that the centers thereof were matched, and the mold was caused to contact the resist. The contact state was maintained for 10 minutes, and then the resist was exposed. Thereafter, the mold and the resist were separated. Thereby, a resist film, onto which the concentric line and space pattern is transferred, was obtained.

(Method for Producing Patterned Substrate)

The quartz substrate was etched using the resist film onto which the line and space pattern was transferred as a mask. The shapes of the protrusions and recesses to the resist film were transferred by the etching operation, to produce the quartz substrate having the predetermined pattern of protrusions and recesses. Etching of the quartz substrate was performed using an ICP (Inductively Coupled Plasma) type reactive ion etching apparatus, with a mixed gas including fluorocarbon, which is a sedimentary gas, as the etching gas, with a bias corresponding to a depth of 100 nm. In addition, the mask was removed by ashing using the same etching apparatus.

Details regarding the mold release agent, the quartz mold, the photocurable resist, and each of the steps are as follows.

(Mold Release Agent)

Optool DSX, which is a mold release agent by Daikin Industries K.K., was dissolved in HD-ZV, which is a fluorine series specialized solvent by Daikin Industries K.K., to prepare a mold release processing liquid containing Optool DSX at 0.1% by weight.

(Method for Coating Mold Release Agent)

DMP-2831, which is an ink jet printer of the piezoelectric type by FUJIFILM Dimatix, was utilized. A dedicated 10 pl head was utilized as an ink jet head. In the primary step and the secondary step of mold production, the droplet arrangement patterns were square lattices, and the intervals among droplets were set to 150 μm.

(Method for Contacting Mold Main Body and Mold Release Processing Substrate)

The mold main body and the mold release processing substrate were caused to approach each other, and positioning was performed while observing alignment marks with an optical microscope from the back surface of the quartz substrate such that the alignment marks were at predetermined positions.

(Resist)

A mixture of the compound represented by Chemical Formula (1), Aronix M-220, IRGACURE 379, and the fluorine monomer represented by Chemical Formula (2) at a ratio of 48:48:3:1 was employed as the photocurable resist.

(Quartz Mold)

The quartz substrate, the surface of which was processed with a silane coupling agent having superior adhesive properties with respect to photocurable resist, was utilized. The surface was processed by diluting the silane coupling agent with a solvent, coating the surface of the substrate with the diluted silane coupling agent by the spin coat method, and then by annealing the coated surface.

(Method for Coating Resist)

DMP-2831, which is an ink jet printer of the piezoelectric type by FUJIFILM Dimatix, was utilized. A dedicated 10 pl head was utilized as an ink jet head. This ink jet head is different from the ink jet head which was utilized to coat the mold release agent. The droplet arrangement pattern was a square lattice, and the intervals among droplets were set to 400 μm.

(Method for Contacting Mold and Quartz Substrate)

The mold and the quartz substrate were caused to approach each other, and positional alignment of the mold and the resist was performed while observing the alignment marks with an optical microscope from the back surface of the quartz mold such that the alignment marks were at predetermined positions.

(Exposure Method)

Exposure was performed by irradiating ultraviolet light that includes a wavelength of 360 nm through the quartz substrate at an irradiation dosage of 300 mJ/cm$^2$.

(Etching Conditions)

The specific etching conditions were as follows. The amount of flow of $CHF_3$ was 20 sccm, the amount of flow of $CF_4$ was 20 sccm, the amount of flow of Ar was 80 sccm, the pressure was 2 Pa, the ICP power was 300 W, and the RIE power was 50 W.

(Ashing Conditions)

The specific ashing conditions were as follows. The amount of flow of $O_2$ was 60 sccm, the pressure was 7 Pa, the ICP power was 200 W, and the RIE power was 0 W.

Comparative Example 1

A mold and a patterned substrate were produced in the same manner as Example 1, except that droplets of mold release agent were arranged at predetermined intervals on the quartz substrate at positions on the surface having radii of 32.5 mm or less (that is, the entire patterned region) in the secondary step of mold production.

Example 2

A mold and a patterned substrate were produced in the same manner as Example 1, except that droplets of mold release agent were arranged at predetermined intervals on the quartz substrate at positions on the surface having radii of 35 mm in the secondary step of mold production.

Example 3

A mold and a patterned substrate were produced in the same manner as Example 2, except that the concentration of the mold release processing liquid was 0.025% by weight.

Example 4

A mold and a patterned substrate were produced in the same manner as Example 2, except that the concentration of the mold release processing liquid was 0.05% by weight.

Example 5

A mold and a patterned substrate were produced in the same manner as Example 2, except that the concentration of the mold release processing liquid was 4% by weight and that the intervals among the droplets of resist were 370 µm.

Example 6

A mold and a patterned substrate were produced in the same manner as Example 2, except that the concentration of the mold release processing liquid was 10% by weight and that the intervals among the droplets of resist were 350 µm.

Example 7

A mold main body is constituted by a Si substrate having a diameter of 200 mm, and a concentric line and space pattern constituted by a plurality of space patterns having depths of 100 nm is formed on a first surface thereof. The width of the space pattern and the intervals among spaces (the widths of the lines) are 100 nm and 100 nm, respectively. The entirety of the concentric line and space pattern is formed within a region having a diameter of 60 mm.
(Mold Production Step)

A quartz substrate with a diameter of 70 mm and a rounded corner was employed as a mold release processing substrate. Droplets of a mold release agent were arranged across the entire surface of the quartz substrate surrounded by the rounded corner by the ink jet method. Then, positional alignment was performed such that the positions of the centers of the mold main body and the quartz substrate are matched, and the mold main body was caused to contact the mold release agent. The state in which the mold main body and the mold release agent are in contact was maintained for 5 minutes, and then the mold and the mold release processing substrate were separated. Thereby, a mold having a mold release layer with a thickness distribution, in which the thicknesses of circumferential positions at a radius of 35 mm from the center (70 mm diameter) are locally maximal continuously along the entire periphery, is obtained.
(Nanoimprinting Method)

After the production step, a quartz substrate with a diameter of 150 mm was employed, and droplets of photocurable resist were arranged on the quartz substrate. Then, the mold and the quartz substrate underwent positional alignment such that the centers thereof were matched, and the mold was caused to contact the resist. The contact state was maintained for 10 minutes, and then the resist was exposed. Thereafter, the mold and the resist were separated. Thereby, a resist film, onto which the concentric line and space pattern is transferred, was obtained.
(Method for Producing Patterned Substrate)

The quartz substrate was etched using the resist film onto which the line and space pattern was transferred as a mask. The shapes of the protrusions and recesses to the resist film were transferred by the etching operation, to produce the quartz substrate having the predetermined pattern of protrusions and recesses. Etching of the quartz substrate was performed using an ICP (Inductively Coupled Plasma) type reactive ion etching apparatus, with a mixed gas including fluorocarbon, which is a sedimentary gas, as the etching gas, with a bias corresponding to a depth of 100 nm. In addition, the mask was removed by ashing using the same etching apparatus.

Details regarding the mole release agent, the quartz mold, the photocurable resist, and each of the steps are as follows.
(Mold Release Agent)

Optool DSX, which is a mold release agent by Daikin Industries K.K., was dissolved in HD-ZV, which is a fluorine series specialized solvent by Daikin Industries K.K., to prepare a mold release processing liquid containing Optool DSX at 0.1% by weight.
(Method for Coating Mold Release Agent)

DMP-2831, which is an ink jet printer of the piezoelectric type by FUJIFILM Dimatix, was utilized. A dedicated 10 pl head was utilized as an ink jet head. In the primary step and the secondary step of mold production, the droplet arrangement patterns were square lattices, and the intervals among droplets were set to 150 µm.
(Method for Contacting Mold Main Body and Mold Release Processing Substrate)

The mold main body and the mold release processing substrate were caused to approach each other, and positioning was performed while observing alignment marks with an optical microscope from the back surface of the quartz substrate such that the alignment marks were at predetermined positions.
(Resist)

A mixture of the compound represented by Chemical Formula (1), Aronix M-220, Irgacure 379, and the fluorine monomer represented by Chemical Formula (2) at a ratio of 48:48:3:1 was employed as the photocurable resist.
(Quartz Mold)

The quartz substrate, the surface of which was processed with a silane coupling agent having superior adhesive properties with respect to photocurable resist, was utilized. The surface was processed by diluting the silane coupling agent with a solvent, coating the surface of the substrate with the diluted silane coupling agent by the spin coat method, and then by annealing the coated surface.
(Method for Coating Resist)

DMP-2831, which is an ink jet printer of the piezoelectric type by FUJIFILM Dimatix, was utilized. A dedicated 10 pl head was utilized as an ink jet head. This ink jet head is different from the ink jet head which was utilized to coat the mold release agent. The droplet arrangement pattern was a square lattice, and the intervals among droplets were set to 400 µm.
(Method for Contacting Mold and Quartz Substrate)

The mold and the quartz substrate were caused to approach each other, and positional alignment of the mold and the resist was performed while observing the alignment marks with an optical microscope from the back surface of the quartz mold such that the alignment marks were at predetermined positions.

(Exposure Method)

Exposure was performed by irradiating ultraviolet light that includes a wavelength of 360 nm through the quartz substrate at an irradiation dosage of 300 mJ/cm$^2$.

Comparative Example 2

A mold and a patterned substrate were produced in the same manner as Example 7, except that a quartz substrate with a diameter of 70 mm and corners which are not rounded was employed.

(Evaluation Method)

The methods for evaluating the Examples and the Comparative Examples will be described below.

(Method for Measuring the Heights of Locally Maximal Points of the Outer Peripheral Mold Release Layers)

The heights D of the locally maximal points of the outer peripheral mold release layers were calculated as an average value of the heights of eight points which were measured by an AFM (Atomic Force Microscope) scanning the eight points (at 0°, 45°, 90°, 135°, 180°, 225°, 270°, and 315°) along the circumferences of the mold release layers having thickness distributions in the radial direction. With respect to Example 1 and Comparative Example 1, the heights of positions along a circumference at a radius of 32.5 mm from the center were measured. With respect to Examples 2 through 7 and Comparative Example 2, the heights of positions along a circumference at a radius of 35 mm from the center were measured.

(Method for Evaluating Restriction of Region in which Resist Flows)

The resist patterns formed by imprinting were observed in a dark field of view with an optical microscope (at 50× magnification). During the observation, 3 mm squares fields of view were defined at 50× magnification. Then, the distances from the outer edges of the patterned regions to the boundaries between the resist and the quartz substrates were measured in directions at the angles of 0°, 45°, 90°, 135°, 180°, 225°, 270°, and 315° with the centers of the substrates as references. Note that scattered light is detected at the outer edges of the patterned regions and at the aforementioned boundaries. Therefore, these locations were specified by observing the scattered light.

With respect to Example 1 and Comparative Example 1, cases in which there were 7 or more locations at which the distance from the outer edge of the patterned region to the aforementioned boundary was 2.5 mm or less were evaluated as "Very Good", cases in which there were 5 or 6 such locations were evaluated as "Good", cases in which there were 3 or 4 such locations were evaluated as "Fair", and cases in which there were 2 or less such locations were evaluated as "Poor". With respect to Examples 2 through 7 and Comparative Example 2, cases in which there were 7 or more locations at which the distance from the outer edge of the patterned region to the aforementioned boundary was 5 mm or less were evaluated as "Very Good", cases in which there were 5 or 6 such locations were evaluated as "Good", cases in which there were 3 or 4 such locations were evaluated as "Fair", and cases in which there were 2 or less such locations were evaluated as "Poor".

(Method for Evaluating Incomplete Filling Defects)

The resist patterns formed by imprinting were observed by an optical microscope (at 50× magnification). During the observation, 3 mm squares fields of view were defined at 50× magnification. Then, three arbitrary points along directions at the angles of 0°, 45°, 90°, 135°, 180°, 225°, 270°, and 315° with the centers of the substrates as references were observed, to measure whether incomplete filling defects were present in the surface o the quartz substrates. In the measurements, portions at which scattered light, which is not observed within normal line and space patterns, were observed were designated as incomplete filling defects. The number of peeling defects and incomplete filling defects was counted. In cases that the number of defects per 3 mm square area was 0, the quartz substrates were evaluated as having no defects. In cases that the number of defects per 3 mm square area was 1 or greater, the quartz substrates were evaluated as having defects.

(Method for Evaluating Uniformity of Residual Film Thickness)

The thicknesses of the residual films of the line and space patterns formed as resist patterns by imprinting in each of the Examples and Comparative Examples were measured from the centers of the patterned regions to the vicinities of the outer edges thereof. The substrates were exposed by peeling portions of the patterned regions of the resist patterns by scratching or tape peeling. Then the boundaries between the peeled regions and the patterned regions were observed with an AFM (Atomic Force Microscope), to measure the residual film thicknesses. Specifically, three arbitrary points along directions at the angles of 0°, 45°, 90°, 135°, 180°, 225°, 270°, and 315° with the centers of the substrates as references were scanned in the radial direction and measured. Cases in which the difference between the maximum measured value and the minimum measured value in each direction was less than 1.5 nm were evaluated as "Very Good". Cases in which the difference between the maximum measured value and the minimum measured value in each direction was within a range from 1.5 nm to 3 nm were evaluated as "Good". Cases in which the difference between the maximum measured value and the minimum measured value in each direction was within a range from 3 nm to 5 nm were evaluated as "Fair". Cases in which the difference between the maximum measured value and the minimum measured value in each direction was 5 nm or greater were evaluated as "Poor".

(Method for Calculating Average Residual Film Thickness)

Average residual film thicknesses were calculated only for resist patterns that were evaluated as having "Very Good" uniformity of residual film thickness. The average residual film thicknesses were obtained by calculating an average value of the residual film thicknesses of the 24 points which were measured during the evaluation of the uniformity of residual film thickness.

(Method for Evaluating Uniformity of Pattern Height of Patterned Substrates)

An AFM was employed to measure the pattern heights of the patterned substrates from the centers of the patterned regions to the vicinities of the outer edges thereof. Specifically, three arbitrary points along directions at the angles of 0°, 45°, 90°, 135°, 180°, 225°, 270°, and 315° with the centers of the substrates as references were scanned in the radial direction and measured. Cases in which the difference between the maximum measured value and the minimum measured value in each direction was less than 3 nm were evaluated as "Very Good". Cases in which the difference between the maximum measured value and the minimum measured value in each direction was within a range from 3 nm to 6 nm were evaluated as "Good". Cases in which the difference between the maximum measured value and the minimum measured value in each direction was greater than or equal to 6 nm and less than 10 nm were evaluated as "Fair". Cases in which the difference between the maximum measured value and the minimum measured value in each direction was 10 nm or greater were evaluated as "Poor".

Table 1 shows the conditions under which production of the mold and nanoimprinting were executed for the Examples and the Comparative Examples. Table 2 shows the results of evaluations for the Examples and the Comparative Examples. From the Tables it can be understood that the mold of the present invention and the nanoimprinting method employing the mold of the present invention enables the region in which resist flows during nanoimprinting without using a mesa type substrate. It can also be understood that the method for producing patterned substrates of the present invention enables production of molds having uniform pattern heights or uniform pattern depths in the production of patterned substrates.

TABLE 1

|  | Locally Maximal Point | Position of Locally Maximal Point | Mold Production Method | | | Nanoimprinting |
|---|---|---|---|---|---|---|
|  |  |  | Mold Release Processing Substrate with Rounded Corner (Primary Step) | Position at which Mold Release Agent is Arranged (Secondary Step) | Concentration of Mold Release Agent (wt %) | Method Intervals among Droplets of Resist (μm) |
| Example 1 | Yes | Center of Outer Peripheral Mold Release Layer | No | Only at Periphery of Patterned Region | 0.1 | 400 |
| Comparative Example 1 | No | n/a | No | Periphery of and Entirety of Patterned Region | 0.1 | 400 |
| Example 2 | Yes | Periphery of Outer Peripheral Mold Release Layer | No | Only at Periphery of Patterned Region | 0.1 | 400 |
| Example 3 | Yes | Periphery of Outer Peripheral Mold Release Layer | No | Only at Periphery of Patterned Region | 0.025 | 400 |
| Example 4 | Yes | Periphery of Outer Peripheral Mold Release Layer | No | Only at Periphery of Patterned Region | 0.05 | 400 |
| Example 5 | Yes | Periphery of Outer Peripheral Mold Release Layer | No | Only at Periphery of Patterned Region | 4 | 370 |
| Example 6 | Yes | Periphery of Outer Peripheral Mold Release Layer | No | Only at Periphery of Patterned Region | 10 | 350 |
| Example 7 | Yes | Periphery of Outer Peripheral Mold Release Layer | Yes | n/a | 0.1 | 400 |
| Comparative Example 2 | No | n/a | No | n/a | 0.1 | 400 |

TABLE 2

|  | Evaluation Results | | | | | |
|---|---|---|---|---|---|---|
|  | Height of Locally Maximal Point (nm) | Restriction of Region of Flow | Incomplete Filling Defects | Uniformity of Residual Film Thickness | Average Residual Film Thickness | Uniformity of Pattern Height in Patterned Substrate |
| Example 1 | 1.5 | Good | None | Good | n/a | Good |
| Comparative Example 1 | n/a | Poor | None | Poor | n/a | Poor |
| Example 2 | 1.5 | Very Good | None | Very Good | 13 | Very Good |
| Example 3 | 0.3 | Fair | None | Fair | n/a | Fair |
| Example 4 | 0.8 | Good | None | Good | n/a | Good |
| Example 5 | 20 | Very Good | None | Very Good | 23 | Very Good |
| Example 6 | 30 | Very Good | None | Very Good | 32 | Fair |
| Example 7 | 1.5 | Very Good | None | Very Good | 13 | Very Good |
| Comparative Example 2 | n/a | Poor | None | Poor | n/a | Poor |

What is claimed is:

1. A nanoimprinting mold, comprising:

a mold main body having a fine pattern of protrusions and recesses on a surface thereof; and a mold release layer formed on the surface of the mold main body; characterized by:

the mold release layer being formed within a mold release layer forming region, which is a region of the mold main body that includes a patterned region where the fine pattern of protrusions and recesses is formed and has an outer edge positioned outside the outer edge of the patterned region; and an outer peripheral mold release layer, which is a part of the mold release layer between an outer edge of the patterned region and the outer edge of the mold release layer forming region, having a thickness distribution in which the thickness of the outer peripheral mold release layer is locally maximal at positions outside the outer edge of the patterned region, substantially continuously along the entire periphery, wherein the outer peripheral mold release layer has portions with the thickness becoming gradually thicker at positions closer to the outer edge thereof.

2. A nanoimprinting mold as defined in claim 1, wherein:
the outer peripheral mold release layer has the thickness distribution in which the thickness of the outer peripheral mold release layer at the outer edge of the mold release layer forming region is locally maximal.

3. A nanoimprinting mold as defined in claim 1, wherein:
the outer peripheral mold release layer has the thickness distribution in which the locally maximal height difference is 1 nm or greater.

4. A nanoimprinting mold as defined in claim 2, wherein:
the outer peripheral mold release layer has the thickness distribution in which the locally maximal height difference is 1 nm or greater.

5. A nanoimprinting mold as defined in claim 1, wherein:
the distance from the positions at which the thickness of the outer peripheral mold release layer is locally maximal to the outer edge of the patterned region is greater than 0 mm and 20 mm or less.

6. A nanoimprinting mold as defined in claim 2, wherein:
the distance from the positions at which the thickness of the outer peripheral mold release layer is locally maximal to the outer edge of the patterned region is greater than 0 mm and 20 mm or less.

7. The nanoimprinting mold as defined in claim 1, wherein the mold release layer comprises a mold release agent which is one of a hydrocarbon series lubricant, a fluorine series lubricant, and a fluorine series silane coupling agent.

8. The nanoimprinting mold as defined in claim 1, wherein the outer peripheral mold release layer has a thickness distribution in which the locally maximal height difference is within a range from 1 nm to 25 nm.

* * * * *